(12) United States Patent
Baek et al.

(10) Patent No.: US 8,358,527 B2
(45) Date of Patent: Jan. 22, 2013

(54) MULTI-LEVEL NONVOLATILE MEMORY DEVICES USING VARIABLE RESISTIVE ELEMENTS

(75) Inventors: In-Gyu Baek, Seoul (KR); Hyun-Jun Sim, Hwaseong-si (KR); Hong-Sik Yoon, Seongnam-si (KR); Jin-Shi Zhao, Hwaseong-si (KR); Min-Young Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 389 days.

(21) Appl. No.: 12/656,754

(22) Filed: Feb. 16, 2010

(65) Prior Publication Data

US 2010/0208508 A1    Aug. 19, 2010

(30) Foreign Application Priority Data

Feb. 16, 2009   (KR) ........................ 10-2009-0012513

(51) Int. Cl.
*G11C 11/00* (2006.01)
*H01L 47/00* (2006.01)
(52) U.S. Cl. ............... 365/148; 365/163; 257/4
(58) Field of Classification Search .................. 365/148, 365/163; 257/4
See application file for complete search history.

(56) References Cited

U.S. PATENT DOCUMENTS

| 6,965,137 | B2 * | 11/2005 | Kinney et al. | 257/295 |
| 7,875,871 | B2 * | 1/2011 | Kumar et al. | 257/2 |
| 2005/0286294 | A1 * | 12/2005 | Campbell | 365/163 |
| 2008/0298114 | A1 * | 12/2008 | Liu et al. | 365/148 |
| 2008/0310211 | A1 * | 12/2008 | Toda et al. | 365/148 |
| 2009/0026433 | A1 * | 1/2009 | Chiang | 257/2 |
| 2010/0163823 | A1 * | 7/2010 | Sim et al. | 257/2 |
| 2011/0049458 | A1 * | 3/2011 | Ahn et al. | 257/2 |
| 2012/0025161 | A1 * | 2/2012 | Rathor et al. | 257/2 |

FOREIGN PATENT DOCUMENTS

| JP | 2007-328857 | 12/2007 |
| KR | 10-2006-0084667 | 7/2006 |
| KR | 10-0790882 | 12/2007 |

* cited by examiner

*Primary Examiner* — Ly D Pham
(74) *Attorney, Agent, or Firm* — Harness, Dickey, Pierce. P.L.C.

(57) ABSTRACT

Multi-level nonvolatile memory devices using variable resistive elements, the multi-level nonvolatile memory devices including a word line, a bit line, and a multi-level memory cell coupled between the word line and the bit line, the multi-level memory cell having first resistance level and a second resistance level higher than the first resistance level when the first and second write biases having the same polarity are applied thereto, and a third resistance level and a fourth resistance level ranging between the first and second resistance levels, when third and fourth write biases having different polarities from each other are applied thereto.

20 Claims, 12 Drawing Sheets

MULTI-LEVEL NONVOLATILE MEMORY DEVICES USING VARIABLE RESISTIVE ELEMENTS

CROSS-REFERENCE TO RELATED APPLICATIONS

This application claims priority under 35 U.S.C. §119 to Korean Patent Application No. 10-2009-0012513 filed on Feb. 16, 2009, in the Korean Intellectual Property Office (KIPO), the entire contents of which is incorporated herein by reference.

BACKGROUND

1. Field of the Invention

Example embodiments of the inventive concepts relate to multi-level nonvolatile memory devices using variable resistive elements.

2. Description of the Related Art

Nonvolatile memory devices using a resistive material may include, for example, phase change random access memories (PRAMs), resistive RAMs (RRAMs), magnetic RAMs (MRAMs) and the like. Dynamic RAMs (DRAMs) or flash memory devices may use charge to store data, while nonvolatile memory devices using a resistive material may store data using a variation in the phase or state of a phase change material (e.g., a chalcogenide alloy (PRAM)), a variation in the resistance of a variable resistive element (e.g., a RRAM), or a variation in the resistance of a magnetic tunnel junction (MTJ) film caused by the magnetized state of a ferromagnetic material (e.g., a MRAM).

A resistive memory cell may include an upper electrode, a lower electrode, and a variable resistive element interposed therebetween. The resistance level of the variable resistive element may vary according to a voltage applied between the upper and lower electrodes. In particular, a filament serving as a current path for a cell may be formed in the variable resistive element. A state where the filament is partially disconnected may be defined as a reset state, a high-resistance state, and/or reset data (data 1). A state where the filament is connected may be defined as a set state, a low-resistance state, and/or set data (data 0). A reset bias voltage, which may have a voltage level at which the filament may be disconnected, may be supplied to write reset data into the resistive memory cells. A set bias voltage, which may have a voltage level at which the filament may be reconnected, may be supplied to write set data into the resistive memory cells. Further, a read bias voltage that has a voltage level at which the state of the filament does not change may be supplied to read the stored data to determine whether the read data is reset data or set data.

Various methods for storing as many bits as possible in a limited wafer space have been developed. For example, one possible way of fabricating an increasing number of nonvolatile memory cells in a limited wafer area is to develop and use more sophisticated lithography methods and apparatuses. Alternatively, the integration degree of a nonvolatile memory device may be increased by storing more than one bit in a memory cell (hereinafter referred to as a multi-level nonvolatile semiconductor memory device).

In particular, in a case of a multi-level nonvolatile memory device using a resistive element, each memory cell may have at least three different resistance levels according to data stored in the memory cell. Recently, methods of accurately writing data in the memory cell have been researched and developed.

SUMMARY

Example embodiments of the inventive concepts may provide multi-level nonvolatile memory devices capable of writing multi-level data in a stable manner.

According to example embodiments of the inventive concepts, a multi-level nonvolatile memory device using a variable resistive element is described, the device including a word line, a bit line, and a multi-level memory cell coupled between the word line and the bit line, the multi-level memory cell having first resistance level and a second resistance level higher than the first resistance level when the first and second write biases having the same polarity are applied thereto, and a third resistance level and a fourth resistance level ranging between the first and second resistance levels, when third and fourth write biases having different polarities from each other are applied thereto.

According to example embodiments of the inventive concepts, a multi-level nonvolatile memory device is described, the device including a word line, a bit line, and a multi-level memory cell coupled between the word line and the bit line, the multi-level memory cell including a first electrode, first and second oxide layers sequentially formed on the first electrode, and a second electrode formed on the second oxide layer, where a resistance state of the first oxide layer varies according to the polarity of write bias applied between the first and second electrodes, and a resistance state of the second oxide layer varies according to the level of write bias applied between the first and second electrodes.

According to example embodiments of the inventive concepts a multi-level memory element is described, the element including a first electrode; a bipolar oxide layer on the first electrode; a unipolar oxide layer on the bipolar oxide layer; and a second electrode on the unipolar oxide layer.

According to example embodiments of the inventive concepts, a multi-level nonvolatile memory device is described, the device including a word line; a bit line; and a multi-level memory cell coupled between the word line and the bit line, the multi-level memory cell including a first electrode, a first oxide layer on the first electrode, the first oxide layer configured to switch between a plurality of first resistance states based on a polarity of a write bias applied between the first and second electrodes, a second oxide layer on the first oxide layer, the second oxide layer configured to switch between a plurality of second resistance states based on a level of the write bias, and a second electrode on the second oxide layer.

According to example embodiments of the inventive concepts, a multi-level nonvolatile memory device is described, the device including a word line; a bit line; and a multi-level memory cell coupled between the word line and the bit line, the multi-level memory cell configured to have a first resistance level upon application of a first write bias, a second resistance level higher than the first resistance level upon application of a second write bias, the second write bias having a same polarity as the first write bias, a third resistance level between the first and second resistance levels upon application of a third write bias, and a fourth resistance level between the first and second resistance levels upon application of a fourth write bias, the third and fourth write biases having different polarities from each other.

BRIEF DESCRIPTION OF THE DRAWINGS

Example embodiments of the inventive concepts will be more clearly understood from the following brief description taken in conjunction with the accompanying drawings. FIGS. 1-13 represent non-limiting, example embodiments as described herein.

FIG. 1 is a block diagram illustrating a variable resistive element used in a multi-level nonvolatile memory device according to example embodiments of the inventive concepts;

FIG. 4 is a graph of resistance ($\Omega$) as a function of voltage (V) for the variable resistive element of FIG. 1, corresponding to the results shown in FIGS. 3A and 3B;

FIG. 5 is a block diagram illustrating nonvolatile memory devices according to example embodiments of the inventive concepts;

FIG. 6 is a circuit diagram illustrating a memory cell array of FIG. 5;

FIG. 7 is a block diagram illustrating write circuits according to example embodiments of the inventive concepts;

FIG. 8 is a diagram illustrating read operations of nonvolatile memory cells used in nonvolatile memory devices according to example embodiments of the inventive concepts;

FIG. 9 is a block diagram illustrating read circuits according to example embodiments of the inventive concepts;

FIG. 10 is a diagram illustrating read operations of multi-level nonvolatile memory devices according to example embodiments of the inventive concepts; and FIGS. 11-13 are diagrams illustrating systems utilizing nonvolatile memory devices according to example embodiments of the inventive concepts.

Figure 1:
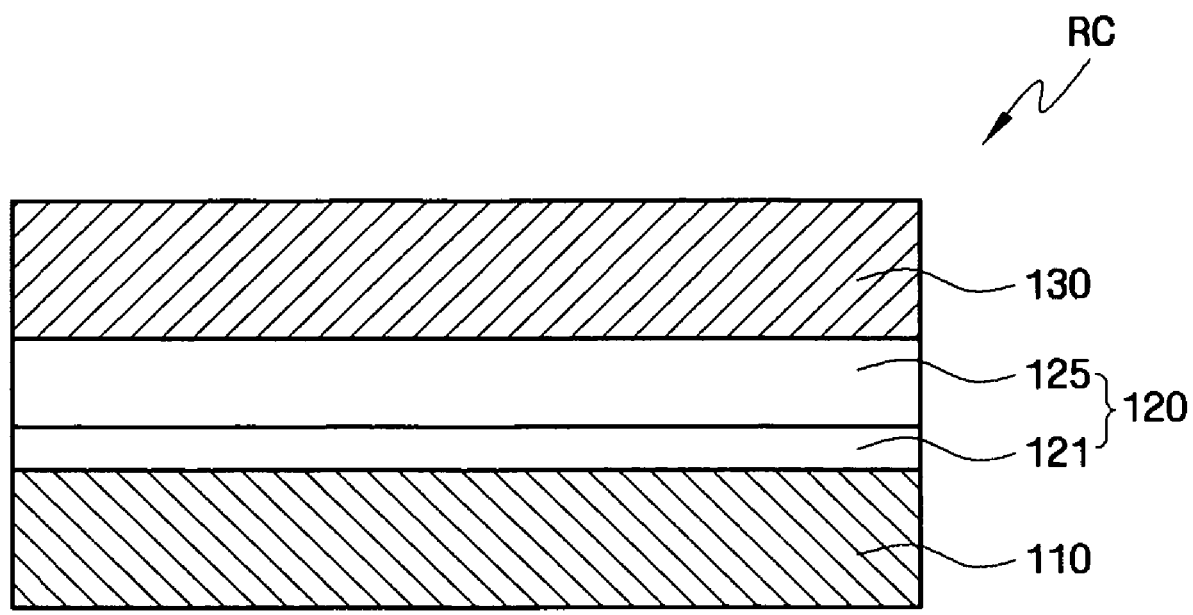

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
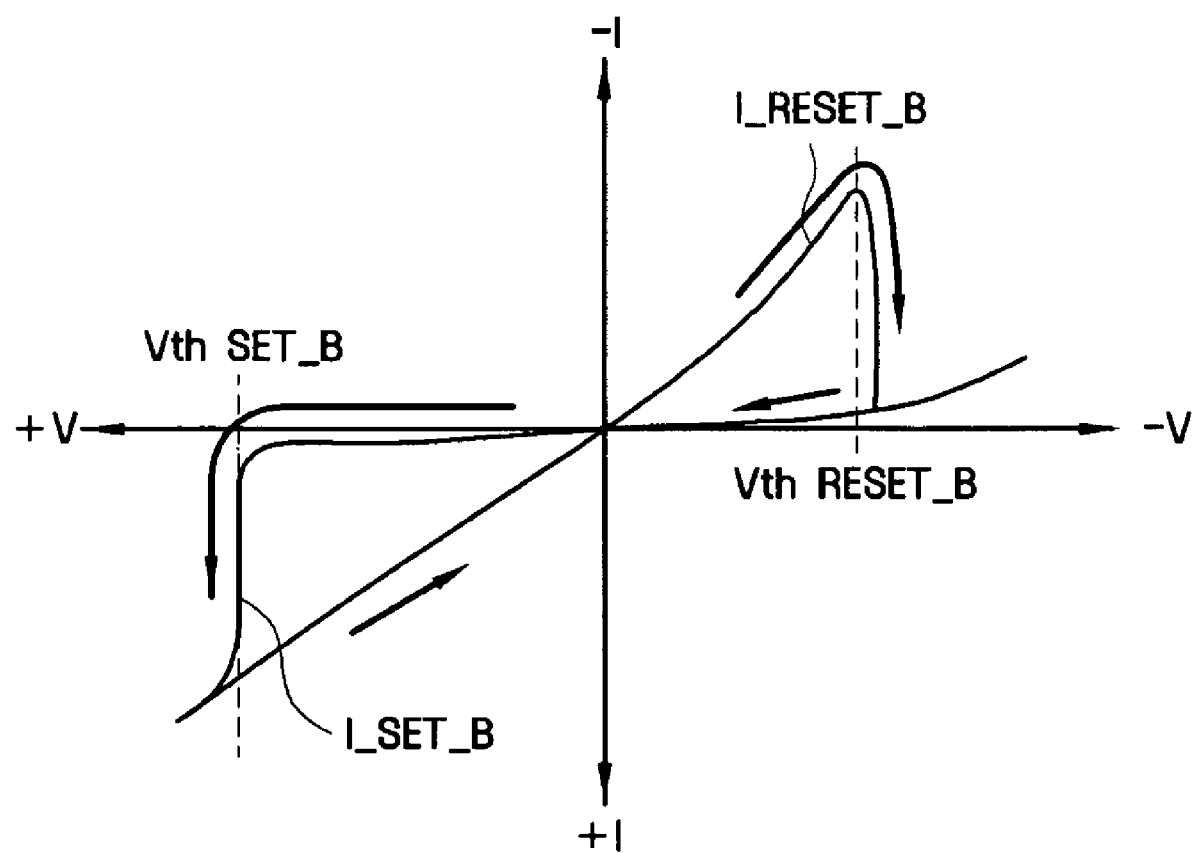
FIG. 2A is a diagram illustrating operational characteristics of a first oxide layer of the variable resistive element shown in FIG. 1.
Figure 2B:
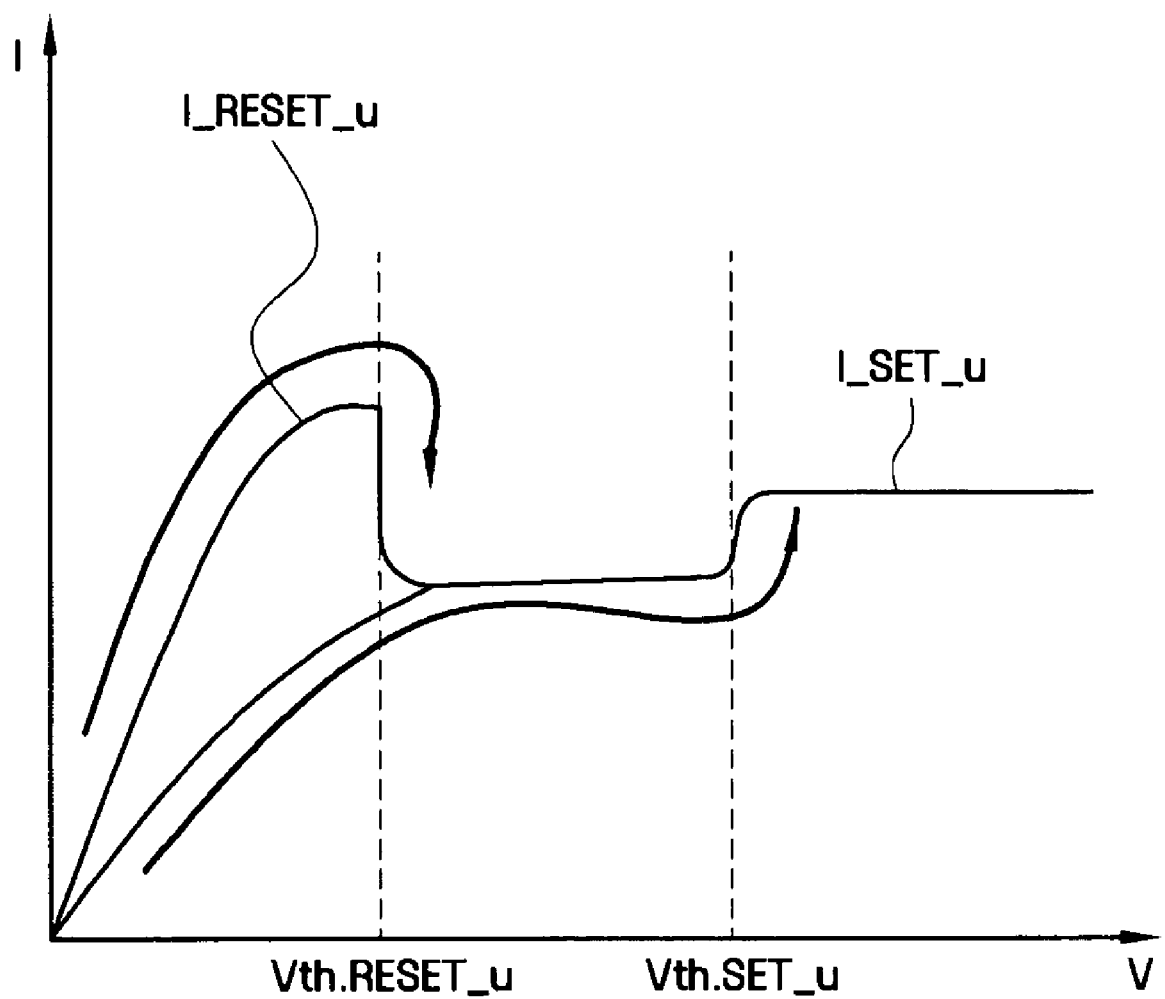
FIG. 2B is a diagram illustrating operational characteristics of the second oxide layer of the variable resistive element shown in FIG. 1.

FIG. 1 is a block diagram illustrating a variable resistive element used in a multi-level nonvolatile memory device according to example embodiments of the inventive concepts. FIG. 2A is a diagram illustrating operational characteristics of a first oxide layer of the variable resistive element shown in FIG. 1. FIG. 2B is a diagram illustrating operational characteristics of the second oxide layer of the variable resistive element shown in FIG. 1. Referring to FIGS. 1-2B, the variable resistive element RC may include a first electrode 110, a variable resistance material layer 120, and a second electrode 130.

The first electrode 110 may include, for example, W, Ti, Ta, Cu, Fe, Co, Ni, Zn, doped Si, and the like. Although not shown, the first electrode 110 may be electrically coupled to a transistor, an access element such as a Zener diode, and/or bit lines or word lines, which are formed on a substrate.

The variable resistance material layer 120 may be interposed between the first and second electrodes 110 and 130. The variable resistance material layer 120 may include a first oxide layer 121 and a second oxide layer 125. The variable resistance material layer 120 may have a plurality of resistance levels according to the levels and/or polarities of write bias voltages applied to the first and second electrodes 110 and 130. As a first write bias and a second write bias having the same polarity or having different polarities are applied across the variable resistance material layer 120, the variable resistance material layer 120 may have a first resistance level or a second resistance level higher than the first resistance level. As third and fourth write bias voltages are applied across the variable resistance material layer 120, the variable resistance material layer 120 may have a third resistance level or a fourth resistance level, the third and fourth resistance levels distributed between the first and second resistance levels.

According to example embodiments of the inventive concepts, the variable resistive element RC may have at least three different resistance levels according to the levels and polarities of write bias voltages applied to the first and second electrodes 110 and 130. Multi-level nonvolatile memory devices using the variable resistive elements RC may be capable of storing two or more bits of data, described below in greater detail with reference to FIGS. 3A-4.

A first oxide layer 121 may be formed on the first electrode 110 and may vary in its resistance level according to the polarity of a write bias applied across the first oxide layer 121 (e.g., write bias voltages applied to the first and second electrodes 110 and 130). The resistance level of the first oxide layer 121 may vary due to a filament current path that may be formed in the first oxide layer 121, or eliminated therefrom, depending on a change in an electric field applied to the first oxide layer 121. The electric field may change according to the polarity of a write bias applied to the first and second electrodes 110 and 130.

The operation of the first oxide layer 121 will now be described in detail with reference to FIG. 2A. In FIG. 2A, the x-axis may indicate a write bias voltage (V) applied across the first oxide layer 121 and the y-axis may indicate a current (I) flowing through the first oxide layer 121. The y-axis values of FIG. 2A are illustrated in a log scale (e.g., logarithmic scale). The graph I_SET_B may indicate a change in the current flowing through the first oxide layer 121 depending on the voltage applied across the first oxide layer 121 when the first oxide layer 121 in a reset state is switched to a set state. The graph I_RESET_B may indicate a change in the current flowing through the first oxide layer 121 depending on the voltage applied across the first oxide layer 121 when the first oxide layer 121 in a set state is switched to a reset state. FIG. 2A illustrates a first reset threshold bias Vth RESET_B having a negative polarity and a first set threshold bias Vth SET_B having a positive polarity, but example embodiments of the inventive concepts are not limited thereto. According to the material used as the first oxide layer, the first reset threshold bias Vth RESET_B may have a positive polarity and the first set threshold bias Vth SET_B may have a negative polarity.

As may be confirmed from the graph I_SET_B, when a write bias greater than a first set threshold bias Vth SET_B having a positive polarity is applied across the first oxide layer 121, a cell current may abruptly increase and a filament current path may be short-circuited in the first oxide layer 121. A resistance level of the first oxide layer 121 may change from a high resistance state (e.g., a reset state), to a low resistance state (e.g., a set state). As may be confirmed from the graph I_RESET_B, when a write bias smaller than the first reset threshold bias Vth RESET_B having a negative polarity is applied across the first oxide layer 121, a cell current may abruptly decrease and a filament current path may be open-circuited in the first oxide layer 121, so that a resistance level of the first oxide layer 121 changes from a low resistance state to a high resistance state.

The first oxide layer 121 may vary in its resistance state according to the polarity of a write bias. The first oxide layer 121 may be defined to have a bipolar characteristic. When the first oxide layer 121 changes from a set state to a reset state, a variation range of the resistance level of the first oxide layer 121 may be relatively smaller than that of a second oxide layer 125. The resistance level may range from about several tens of thousands of ohms ($\Omega$) to about several hundreds of thousands of ohms ($\Omega$).

The first oxide layer 121 may include, for example, oxides made of a metal (e.g., tungsten (W), titanium (Ti), tantalum (Ta), copper (Cu), and/or iron (Fe)). The first oxide layer 121 may be, for example, about 10 nm. A concentration of oxygen in the first oxide layer 121 may increase gradually from the first electrode 110 to the second electrode 130. The first oxide layer 121 may be formed by, for example, oxidizing an upper portion of the first electrode 110 made of, for example, a metal (e.g., W, Ti, Ta, Cu and/or Fe). A material of the first electrode 110 may be determined based on the material of the first oxide layer 121. For example, the first oxide layer 121 may include tungsten oxide formed by oxidizing the upper portion of the first electrode 110 made of tungsten (W). The material for the first electrode 110 may be unlike the material for the second electrode 130.

The second oxide layer 125 may be on the first oxide layer 121. The second oxide layer 125 may vary in its resistance level according to the level of a write bias applied to the first and second electrodes 110 and 130. The resistance level of the second oxide layer 125 may vary because a filament current path may be formed in the second oxide layer 125, or eliminated therefrom, depending on a change in the joule heat according to the level of write bias applied to the first and second electrodes 110 and 130 (e.g., the voltages applied to ends of the first and second electrodes 110 and 130). The operation of the second oxide layer 125 will now be described in detail with reference to FIG. 2B.

In FIG. 2B, the x-axis may indicate a write bias voltage (V) applied across the second oxide layer 125 and the y-axis may indicate a current (I) flowing through the second oxide layer 125. As in FIG. 2A, y-axis values are illustrated in a log scale in FIG. 2B. In FIG. 2B, the graph I_SET_u and the graph I_RESET_u indicate a change in the current flowing through the second oxide layer 125 depending on the voltage applied across the second oxide layer 125 when the second oxide layer 125 in a reset state is switched to a set state and when the second oxide layer 125 in a set state is switched to a reset state.

FIG. 2B illustrates that the second reset threshold bias Vth.RESET_u and the second set threshold bias Vth.SET_u have positive polarity, but aspects of the invention are not limited thereto. For example, the second oxide layer 125 may have a second reset threshold bias Vth.RESET_u having negative polarity. The resistance level of the second oxide layer 125 may change in accordance with the level of the write bias, for example, the difference between the absolute values of the applied voltages, regardless of whether the polarity of the write bias is determined by positive or negative voltages. The resistance state of the second oxide layer 125 may be switched to a reset state or a set state using a single voltage polarity and may be defined to have a unipolar characteristic.

As may be seen in FIG. 2B, I_SET_u, when a write bias greater than the second reset threshold bias Vth.RESET_u and smaller than the second set threshold bias Vth.SET_u is applied across the second oxide layer 125, a cell current may abruptly decrease and a filament current path may be open-circuited in the second oxide layer 125. A resistance level of the second oxide layer 125 may change from a low resistance state to a high resistance state. When a write bias greater than the second set threshold bias Vth.SET_u is applied across the second oxide layer 125, a cell current may abruptly increase and a resistance level of the second oxide layer 125 may change from a high resistance state to a low resistance state.

When a write bias greater than the absolute value of the second set threshold bias Vth.SET_u and smaller than the first reset threshold bias Vth RESET_B is applied across the second oxide layer 125, a cell current may abruptly increase. A filament current path may be open-circuited in the first oxide layer 121 (bipolar switching) and short-circuited in the second oxide layer 125 (unipolar switching). A resistance level of the first oxide layer 121 may change from a low resistance state to a high resistance state. A resistance level of the second oxide layer 125 may change from a high resistance state to a low resistance state. When the second oxide layer 125 changes from a set state to a reset state, a variation range of the resistance level of the second oxide layer 125 may be relatively greater than that of the first oxide layer 121. A variation range may range from about several thousands of ohms (Ω) to about several millions of ohms (Ω).

The second oxide layer 125 may include, for example, a metal oxide (e.g., an oxide of nickel (Ni), titanium (Ti), cobalt (Co), aluminum (Al), zinc (Zn), hafnium (Hf), niobium (Nb), and/or zirconium (Zr)). The second oxide layer 125 may be thicker (e.g., about 10-100 nm) than the first oxide layer 121. The second oxide layer 125 may have a relatively uniform concentration of oxygen compared to the first oxide layer 121. According to example embodiments of the inventive concepts, the second oxide layer 125 may be formed by, for example, depositing a metal layer on the first oxide layer 121 and oxidizing the metal layer.

The second electrode 130 may be on the second oxide layer 125. The second electrode 130 may include, for example, iridium (Ir), ruthenium (Ru), platinum (Pt), tungsten (W), aluminum (Al), nickel (Ni), niobium (Nb), tantalum (Ta), molybdenum (Mo), copper (Cu), iridium oxide, ruthenium oxide, platinum oxide, titanium nitride (TiN), titanium aluminum nitride (TiAlN), and/or combinations thereof. The second electrode 130 may be electrically coupled to a transistor, an access element such as a Zener diode, and/or bit lines or word lines, which may be on a substrate. As described above, a first oxide layer 121 may be formed by oxidizing an upper portion of the first electrode 110. The second electrode 130 may include a material different from the first electrode 110. For example, the first electrode 110 may be tungsten (W) and the second electrode 130 may be ruthenium (Ru).

Figure 3A:
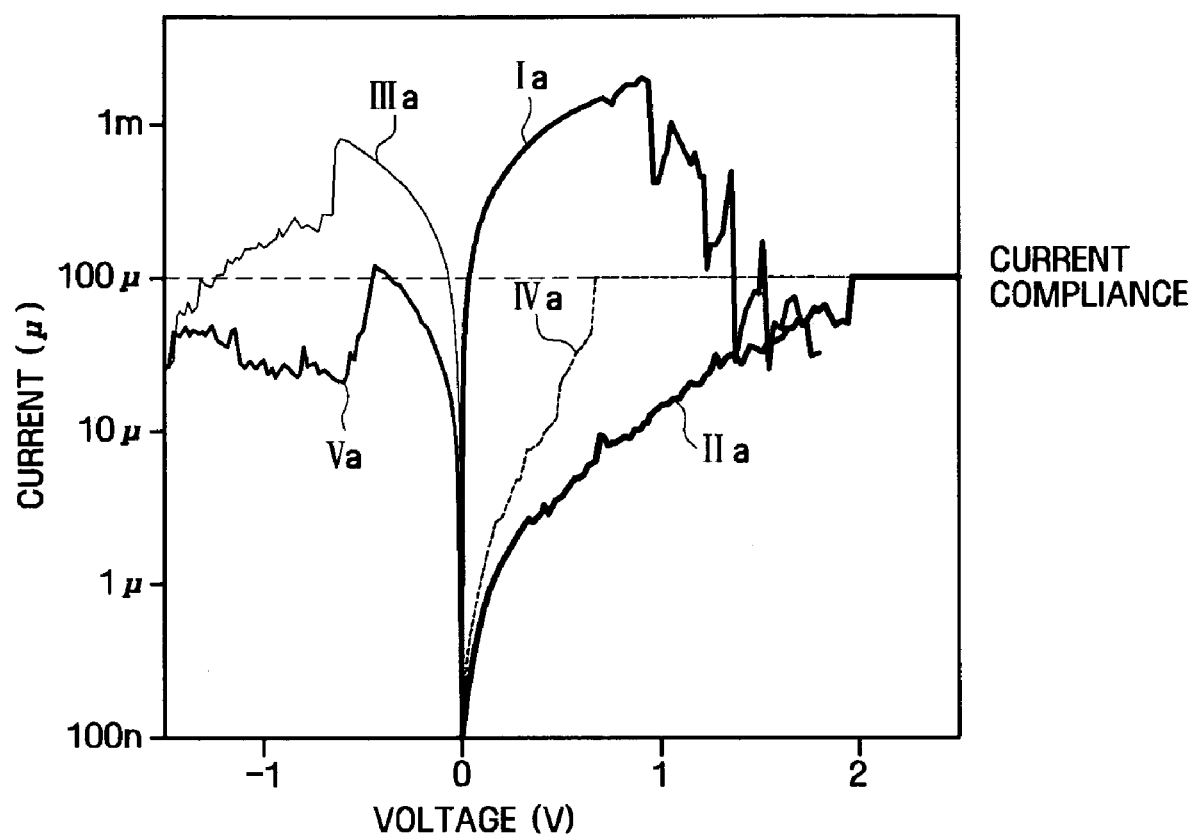
FIGS. 3A and 3B are graphs of current ($\mu$) as a function of voltage (V) for the variable resistive element shown in FIG. 1.
Figure 3B:
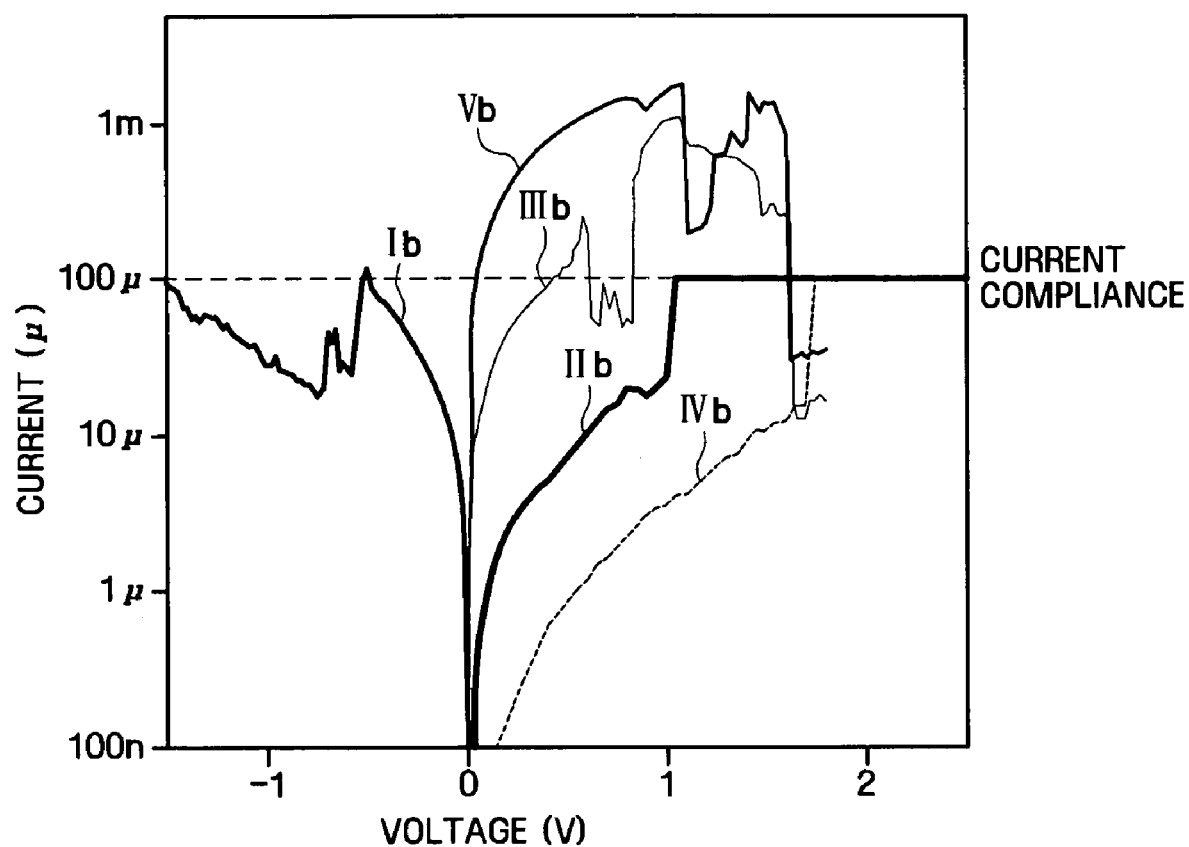
Figure 4:
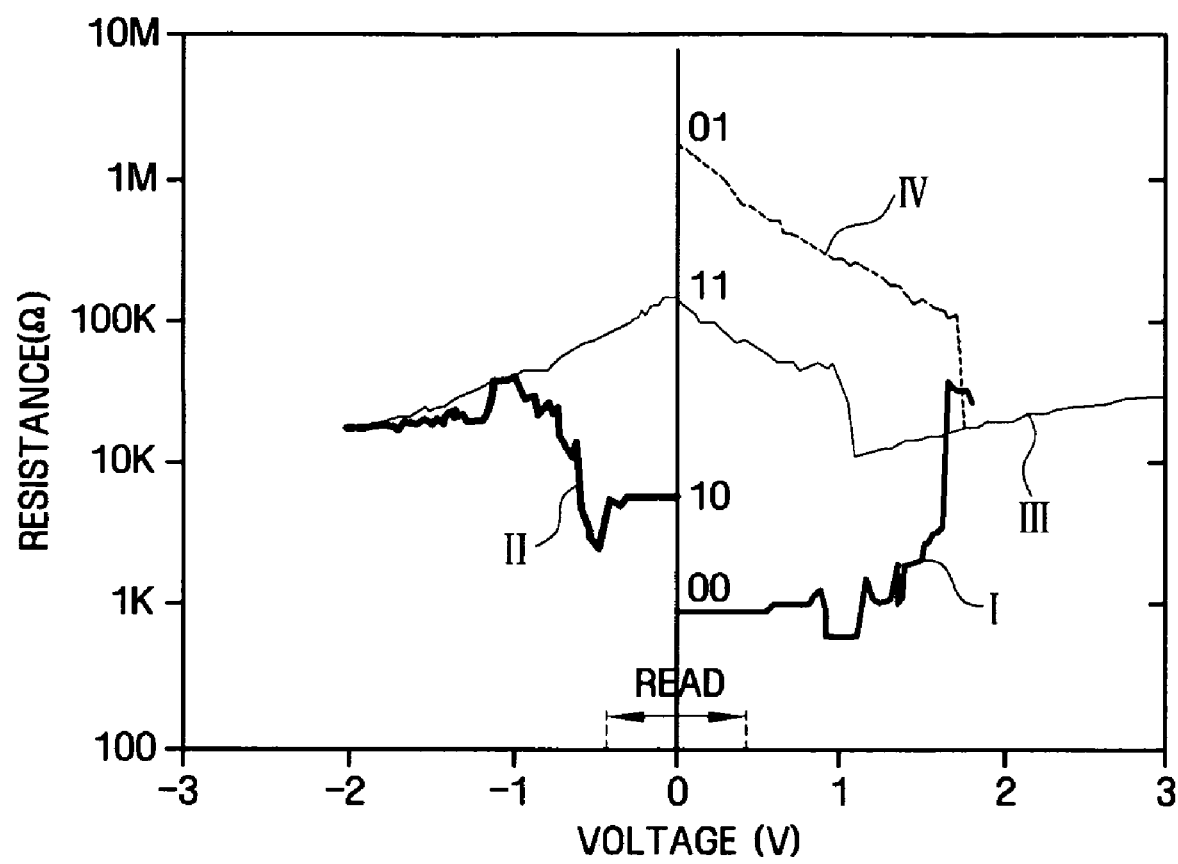

FIGS. 3A and 3B are graphs of current (μ) as a function of voltage (V) for the variable resistive element shown in FIG. 1. FIG. 4 is a graph of resistance (Ω) as a function of voltage (V) for the variable resistive element of FIG. 1, based on the results shown in FIGS. 3A and 3B. The graphs illustrated in FIGS. 3A-4 show changes in current and resistance values depending on the voltages applied to the first and second electrodes 110 and 130. The current and resistance values may be measured after the first and second electrodes 110 and 130 are formed using tungsten (W) and ruthenium (Ru), respectively, and the first and second oxide layers 121 and 125 are formed using tungsten oxide and nickel oxide. The polarities of voltages applied to the first and second electrodes 110 and 130 are varied according to the polarity of voltage applied to the second electrode 130. As illustrated in FIGS. 3A and 3B, damage to the variable resistive element may be reduced and/or prevented due to overcurrent using a current compliance of 100 μA.

Referring to FIG. 3A, the x-axis may indicate a voltage (V) applied between both ends of the first and second electrodes 110 and 130. The y-axis may indicate a current (I) flowing through the variable resistive element RC. The y-axis values are illustrated in a log scale in FIG. 3A. Referring to FIG. 3A, change in the current flowing through the variable resistive element RC may depend on the voltages applied to the first and second electrodes 110 and 130 when the second oxide layer 125 is sequentially changed to a reset state and a set state, and as the first oxide layer 121 is sequentially changed to a reset state and a set state, respectively. In FIG. 3A, the graph Ia may indicate a current change when the second oxide layer 125 in a set state is switched to a reset state. The graph IIa may indicate a current change when the second oxide layer 125 in a reset state is switched to a set state. The graph IIIa may indicate a current change when the first oxide layer 121 of the first and second oxide layers 121 and 125 in set states is first switched to the set state. The graph IVa may indicate a current change when the first oxide layer 121 in a reset state is switched to a set state. The graph Va may indicate a current change when the first oxide layer 121 in a set state is switched to a reset state.

Referring to FIG. 3B, change in the current flowing through the variable resistive element RC may depend on the voltages applied to the first and second electrodes 110 and 130 when the first oxide layer 121 is sequentially changed to a reset state and a set state, and the second oxide layer 125 is sequentially changed to a reset state and a set state, respectively. In FIG. 3B, the graph Ib may indicate a current change when the first oxide layer 121 is changed to a reset state. The graph IIb may indicate a current change when the first oxide layer 121 in a reset state is switched to a set state. The graph IIIb may indicate current changes when the second oxide layer 125 of the first and second oxide layers 121 and 125 in set states is first switched to the set state. The graph IVb may indicate a current change when the second oxide layer 125 in a reset state is switched to a set state. The graph Vb may indicate a current change when the second oxide layer 125 in a set state is switched to a reset state.

Referring to FIGS. 3A and 3B, it may be understood that there may be a change in the current flowing through the variable resistive element RC when the first oxide layer 121 or the second oxide layer 125 is switched to a set state or a reset state by varying the level and/or polarity of the voltage applied across the variable resistive element RC. The resistance level of the variable resistive element RC may change according to the level and/or polarity of the voltage applied across the variable resistive element RC. The voltage-resistance characteristics are illustrated in FIG. 4.

Referring to FIG. 4, the x-axis may indicate a voltage (V) applied between both ends of the first and second electrodes 110 and 130. The y-axis may indicate a resistance of the variable resistive element RC. The graph I may indicate a change in the resistance of the variable resistive element RC corresponding to the applied voltage (V) when the second oxide layer 125 in a set state is switched to a reset state. The graph II may indicate a change in the resistance of the variable resistive element RC corresponding to the applied voltage (V) when the first oxide layer 121 in a set state is switched to a reset state. The graph III may indicate a change in the resistance of the variable resistive element RC corresponding to the applied voltage (V) when the first oxide layer 121 in a reset state is switched to a set state. The graph IV may indicate a change in the resistance of the variable resistive element RC corresponding to the applied voltage (V) when the second oxide layer 125 in a reset state is switched to a set state.

It is understood that the variable resistive element RC used in a multi-level nonvolatile memory device according to example embodiments of the inventive concepts may have at least four different resistance states (e.g., levels) "00", "10", "11", and "01" in a read bias period READ. An example of states of the first and second oxide layers 121 and 125 in the respective resistance states "00", "10", "11", and "01" are summarized in Table 1.

TABLE 1

| Resistance State | Previous State | | Present State | |
|---|---|---|---|---|
| | First oxide layer 121 | Second oxide layer 125 | First oxide layer 121 | Second oxide layer 125 |
| 00 | Set | Reset | Set | Set |
| 10 | Reset | Set | Set | Set |
| 11 | — | — | Reset | Set |
| 01 | — | — | Set | Reset |

Referring to Table 1, the resistance level may increase in sequence from "00", "10", "11", to "01", and a difference between the respective resistance levels may be about 10 times (e.g., an order of magnitude between levels. The variable resistive element RC may have the highest resistance level "01" when the second oxide layer 125 is in a reset state. The variable resistive element RC may have the second highest resistance level "11" when the first oxide layer 121 is in a reset state. The variable resistive element RC may exhibit hysteresis in the resistance level when the first and second oxide layers 121 and 125 are both at a set state. When the second oxide layer 125 is switched from a reset state to a set state, even if the first and second oxide layers 121 and 125 are both at a set state, the variable resistive element RC has a resistance level "00", which is lower than a resistance level "10" corresponding to a resistance level when the first oxide layer 121 is switched from the reset state to a set state.

According to example embodiments of the inventive concepts, the variable resistive element RC may have multiple resistance levels according to the level and/or polarity of the write bias applied between both ends of the first and second electrodes 110 and 130. A multi-level nonvolatile memory device can store data of two or more bits using the variable resistive element and write bias application method.

Hereinafter, multi-level nonvolatile memory devices using the variable resistive element and the method of applying the write bias will be described with reference to FIGS. 5 and 6.

Figure 5:
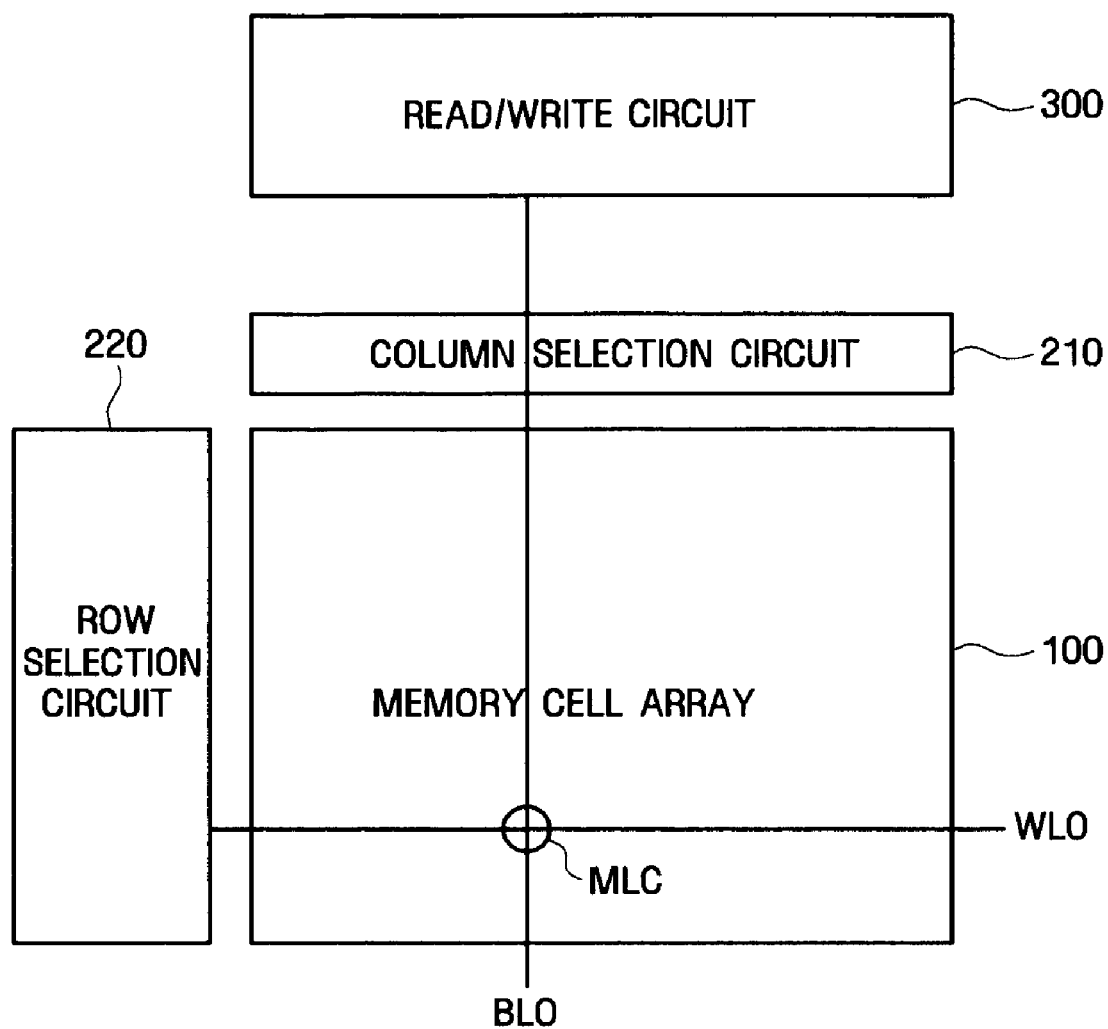

FIG. 5 is a block diagram illustrating nonvolatile memory devices according to example embodiments of the inventive concepts. FIG. 6 is a circuit diagram illustrating a memory cell array of FIG. 5.

Figure 6:
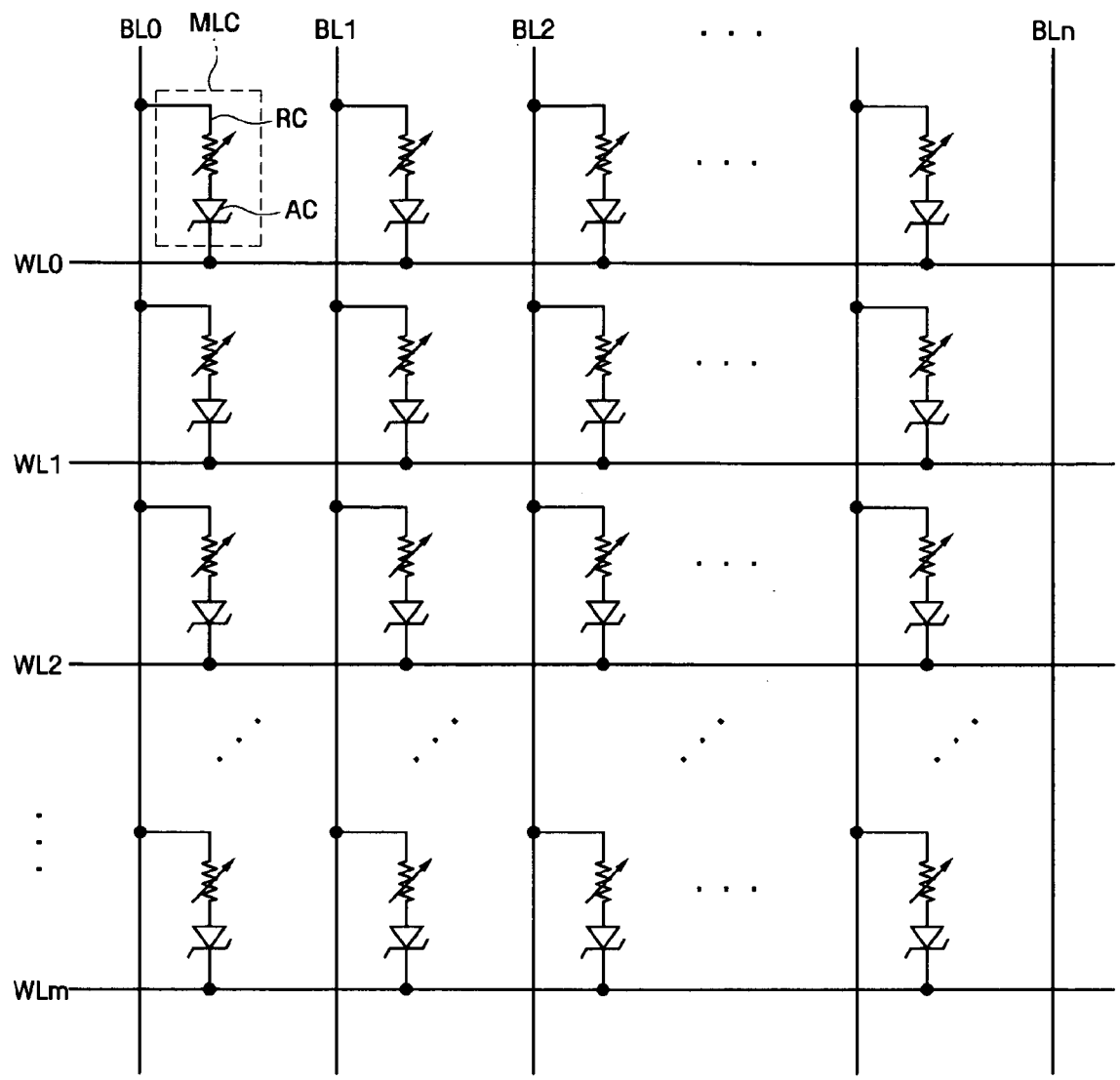

Referring to FIGS. 5 and 6, the multi-level nonvolatile memory device according to embodiments of the present invention may include a memory cell array 100, a column selection circuit 210, a row selection circuit 220 and a read/write circuit 300.

The memory cell array 100 may include a plurality of multi-level memory cells MLC arranged in a matrix. The plurality of multi-level memory cells MLC may be coupled between word lines WL0, WL1, WL2 ... WLm and bit lines BL0, BL1, BL2 ... BLn, respectively. Each of the plurality of multi-level memory cells MLC may include a variable resistive element RC having three or more different resistance levels and an access element AC that controls the current flowing through the variable resistive element RC. As described above with reference to FIGS. 1-4, the variable resistive element RC may have multiple resistance levels according to the level and/or polarity of a write bias applied between both ends of the variable resistive element RC. For example, the variable resistive element RC capable of storing data of 2 bits may have 4 resistance levels 00, 10, 11, and 01 corresponding to 00, 10, 11 and 01 data, respectively. The respective resistance levels may gradually increase in the order of the 00 data, 10 data, 11 data and 01 data. The access element AC may be, for example, a Zener diode or a transistor serially coupled to the variable resistive element RC. While a Zener diode used as the variable resistive element RC is illustrated, aspects of the present invention are not limited thereto and the Zener diode is merely an example.

The column selection circuit 210 may select one or more bit lines (e.g, BL0) among the plurality of bit lines BL0-BLn. The row selection circuit 220 may select one or more word lines (e.g., WL0) among the plurality of word lines WL0-WLm.

The read/write circuit 300 may include a write circuit 310 (e.g., see FIG. 7) that may write data into a multi-level memory cell MLC selected in the memory cell array 100. The read/write circuit may include a read circuit 350 (e.g., see FIG. 9) that may read the stored data from the selected multi-level memory cell MLC.

Figure 7:
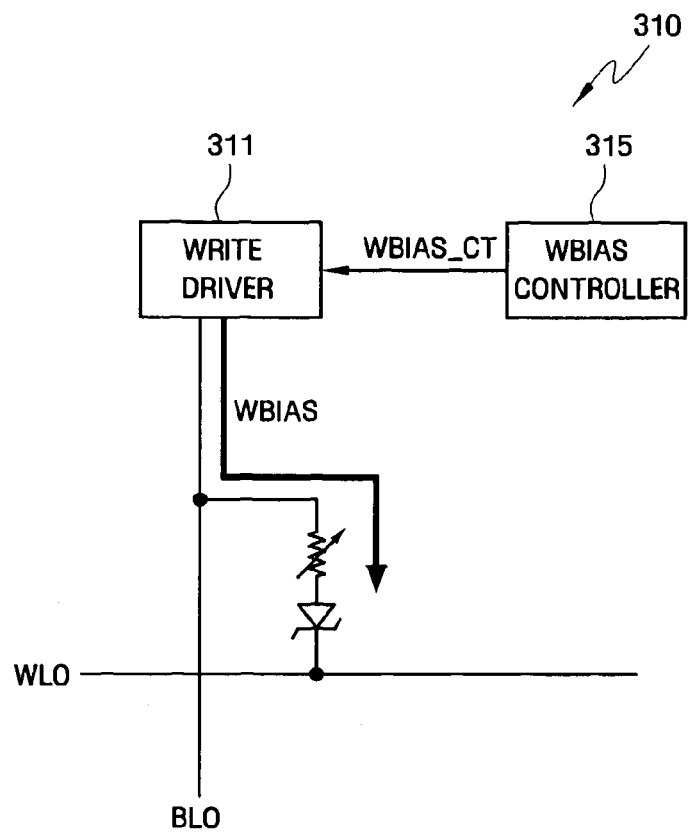
Figure 8:
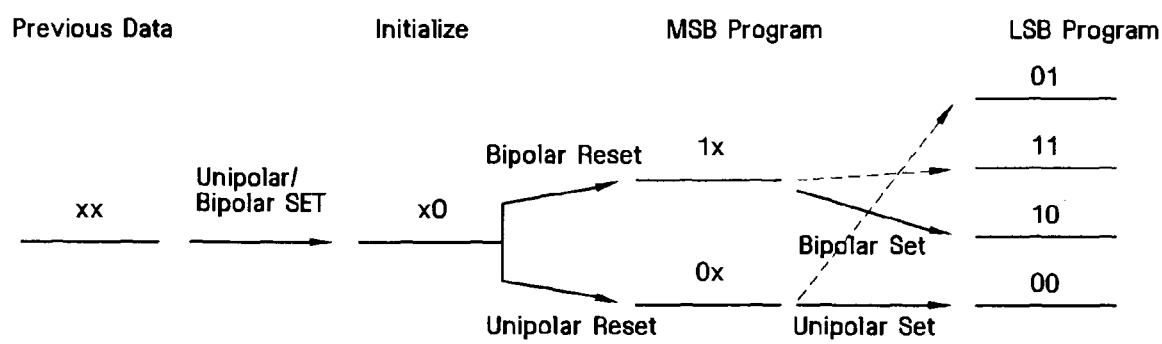

FIG. 7 is a block diagram illustrating write circuits according to example embodiments of the inventive concepts. FIG. 8 is a diagram illustrating read operations of nonvolatile memory cells used in nonvolatile memory devices according to example embodiments of the inventive concepts.

Referring to FIGS. 7 and 8, the write circuit 310 may supply a write bias WBIAS to a selected multi-level memory cell MLC of the memory cell array 100 for writing data. As illustrated in FIG. 7, the write circuit 310 may include a write bias controller WBIAS CONTROLLER 315 and a write driver WRITE DRIVER 311.

The write bias controller 315 may supply a write bias control signal WBIAS_CT to the write driver 311 in response to write data. The write bias controller 315 may supply the write bias control signal WBIAS_CT to the write driver 311 according to the write data for controlling the level and/or polarity of the write bias WBIAS supplied from the write driver 311.

The write driver 311 may supply the write bias WBIAS to the selected multi-level memory cell MLC in response to the write bias control signal WBIAS_CT. The level and polarity of the write bias WBIAS may vary according to the write data. For example, the write bias WBIAS may include first through fourth write biases having different levels and/or polarities from one another.

For example, the first through third write biases may have the same polarity but have different levels and the fourth write bias may have different polarity from the first through third write biases. The first through third write biases may have a positive polarity value. Referring to FIGS. 2A, 2B and 7, the level of the first write bias may be greater than that of the first set threshold bias Vth.SET_B and smaller than that of the second reset threshold bias Vth.RESET_u. The level of the second write bias may be greater than that of the second reset threshold bias Vth.RESET_u and smaller than that of the second set threshold bias $V_{th}\_SET\_U$. The level of the third write bias may be greater than that of the second set threshold bias $V_{th}\_SET\_U$. The level of the fourth write bias WBIAS may have a negative polarity value and may be smaller than that of the first reset threshold bias Vth RESET_B.

Hereinafter, the write operation of the multi-level nonvolatile memory device may be described with reference to FIG. 8. Referring to FIG. 8, "BIPOLAR SET"/"BIPOLAR RESET" may be used to indicate that the first oxide layer of the variable resistive element is set/reset, and "UNIPOLAR SET"/"UNIPOLAR RESET" may be used to indicate that the second oxide layer of the variable resistive element is set/reset, respectively. Dotted lines shown in FIG. 8 may be used to indicate that a resistance state of the variable resistive element is maintained unchanged by supplying no separate write bias.

According to an initialization operation Initialize, the first and second oxide layers 121 and 125 of the variable resistive element RC may be switched to set states to initialize the variable resistive element RC. The resistance state of the variable resistive element RC may be "00" or "10" according to the previous resistance state (or pre-stored data). For example, when the previous resistance state is "01", the initial state of the variable resistive element RC may be "00". When the previous resistance state is "11", the initial state of the variable resistive element RC may be "10".

According to a most significant bit (MSB) operation MSB Program, a write bias WBIAS may supplied in response to the MSB of the write data to change a resistance state of the first oxide layer 121 or the second oxide layer 125 to a reset state. For example, when the MSB of write data is "1", the write bias WBIAS having negative polarity, which is smaller than the first reset threshold bias Vth RESET_B, may be supplied to switch the first oxide layer 121 to a reset state. However, when the MSB of write data is "0", the write bias WBIAS having positive polarity, which is greater than the second reset threshold bias Vth.RESET_u and less than the second set threshold bias Vth.SET_u, may be supplied to switch the second oxide layer 125 to a reset state.

According to a least significant bit (LSB) operation LSB Program, a write bias WBIAS may be supplied in response to the LSB of the write data, thereby changing a resistance state of the first oxide layer 121 or the second oxide layer 125 to a set state.

Alternatively, a separate write bias WBIAS may not be supplied, thereby maintaining the resistance state of the variable resistive element RC. For example, when the write data is "00", the write bias WBIAS having positive polarity, which is greater than the second set threshold bias Vth.SET_u, may be supplied, thereby switching the second oxide layer 125 to a set state. When the write data is "10", the write bias WBIAS having positive polarity, which is greater than the first set threshold bias Vth SET_B and less than the second reset threshold bias Vth.RESET_u, thereby switching the first oxide layer 121 to a set state. However, when the write data is "01" or "11", a separate write bias WBIAS may not be supplied, thereby maintaining the resistance state of the variable resistive element RC formed by programming the MSB of the write data. According to FIG. 8, the initialize operation, the MSB program operation and the LSB program operation may be performed sequentially.

While it has been described that the initialize operation, the MSB program operation and the LSB program operation may be employed in the operation of writing data into the multi-level nonvolatile memory device, aspects of the present invention are not limited thereto. For example, according to example embodiments of the inventive concepts, when a multi-level nonvolatile memory device employs a write verify operation, some of the initialize operation, the MSB program operation and the LSB program operation may selectively not be involved. For example, before writing data, the data pre-stored in the multi-level memory cell MLC may be read, hereinafter referred to as verify data. The verify data and the to-be-written data may be compared with each other. The to-be-written data may then be only written into a 'fail' multi-level memory cell MLC in which the verify data and the to-be-written data are different from each other.

Figure 9:
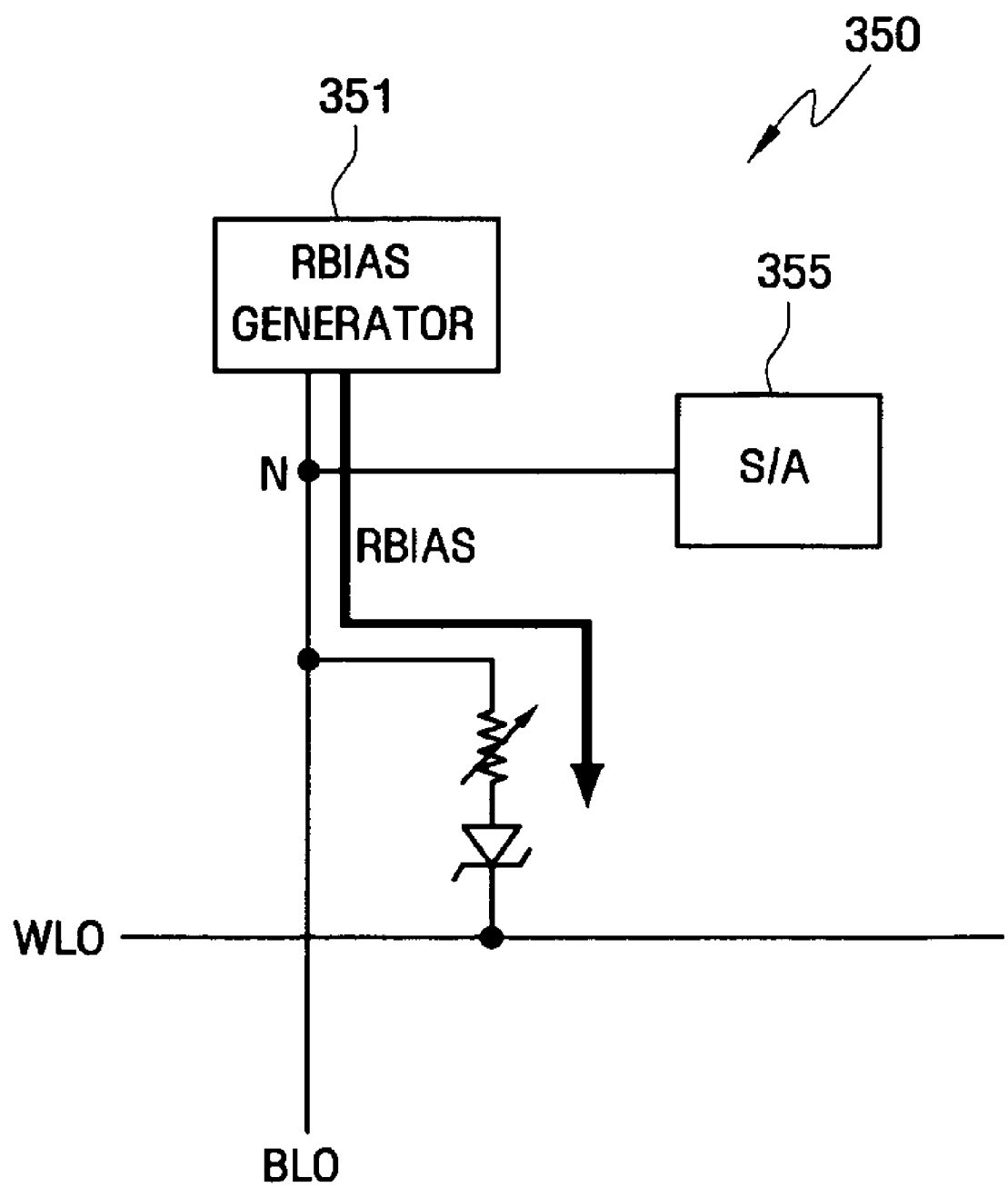
Figure 10:
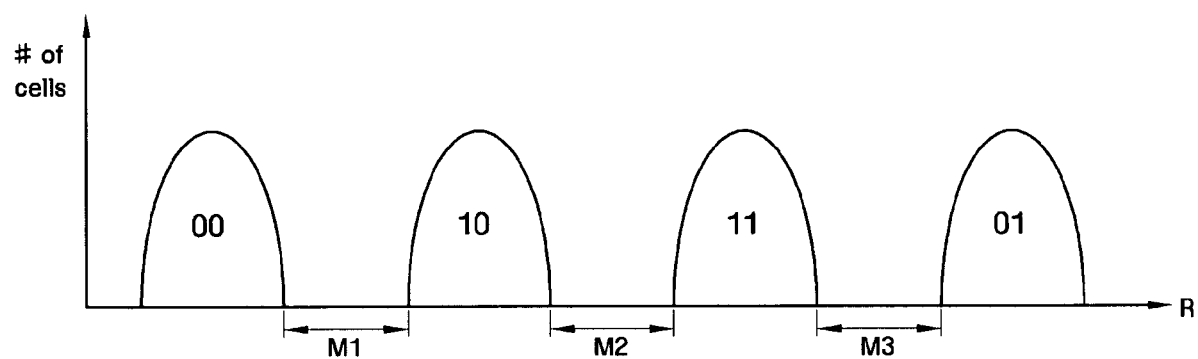

FIG. 9 is a block diagram illustrating read circuits according to example embodiments of the inventive concepts. FIG. 10 is a diagram illustrating read operations of multi-level nonvolatile memory devices according to example embodiments of the inventive concepts.

Referring to FIG. 9, the read circuit 350 may read data stored in the selected Multi-level memory cell MLC. The read circuit 350 may include a read bias supply unit RBIAS GENERATOR 351 and a sensing unit S/A 355.

The read bias supply unit 351 may supply a read bias RBIAS to a selected multi-level memory cell MLC for reading the resistance level of the selected multi-level memory cell MLC. According to example embodiments of the inventive concepts illustrated in FIG. 10, the read bias RBIAS may include a first read bias having a level corresponding to the resistance in a first resistance margin M1, a second read bias having a level corresponding to the resistance in a second resistance margin M2, and a third read bias having a level corresponding to the resistance in a third resistance margin M3.

The sensing unit 355 may sense a level change of the sensing node N as the read bias RBIAS is supplied to the selected multi-level memory cell MLC. For example, the sensing unit 355 may compare the level of the sensing node N with that of a reference bias, output a high level as a comparison result when the level of the sensing node N is higher than that of the reference bias, and output a low level when the level of the sensing node N is lower than that of the reference bias. The read circuit 350 may be capable of reading the data stored in the multi-level memory cell MLC.

The read circuit 350 may include a clamping circuit that clamps a voltage level of a bit line (not shown), a precharge circuit that precharges the bit line (not shown), and a discharge circuit that discharges the bit line (not shown).

Hereinafter, the read operation of the nonvolatile memory device will be described with reference to FIG. 10. In FIG. 10, the x-axis may indicate resistance R and the y-axis may indicate a number of memory cells. Each of a plurality of multi-level memory cells MLC may have four different resistance levels 00, 10, 11, and b 01, and resistance margins M1, M2, and M3 may be arranged between each of the respective resistance levels 00, 10, 11, and 01. The first resistance margin M1 may be arranged between the first resistance level 00 and the second resistance level 10. The second resistance margin M2 may be arranged between the second resistance level 10 and the third resistance level 11. The third resistance margin M3 may be arranged between the third resistance level 11 and the fourth resistance level 01.

According to example embodiments of the inventive concepts, the read circuit 350 may sequentially supply the first through third read biases for determining resistance levels of the multi-level memory cells MLC in a partitioning manner. The read circuit 350 may supply the first read bias to determine whether the resistance level of the multi-level memory cell MLC is 00 or not (whether the resistance level of the multi-level memory cell MLC is 00 or one of 10, 11 and 01). The read circuit 350 may supply the second read bias to determine whether the resistance level of the multi-level memory cell MLC is one of 00 and 10 or one of 11 and 01. The read circuit 350 may supply the third read bias to determine whether the resistance level of the multi-level memory cell MLC is 01 or not (whether the resistance level of the multi-level memory cell MLC is 01 or one of 00, 10 and 11).

The read biases may or may not be supplied in the sequences described above.

For example, the read circuit 350 may supply the second read bias to a selected multi-level memory cell MLC to primarily determine the resistance level stored in the multi-level memory cell MLC and the read circuit 350 may supply the first read bias or the third read bias based on the determination result to finally determine the resistance level stored in the multi-level memory cell MLC.

The read circuit 350 may supply the second read bias to determine whether the resistance level of the multi-level memory cell MLC is one of 00 and 10 or one of 11 and 01.

When it is determined that the resistance level of the multi-level memory cell MLC is one of 00 and 10, the read circuit 350 may supply the first read bias to determine whether the resistance level of the multi-level memory cell MLC is 00 or 10. When it is determined that the resistance level of the multi-level memory cell MLC is one of 11 and 01, the read circuit 350 may supply the third read bias to determine whether the resistance level of the multi-level memory cell MLC is 11 or 01.

While the illustrated reading operation applied to the multi-level nonvolatile memory device according to example embodiments of the inventive concepts have been described above, the embodiments of the inventive concepts are not limited thereto.

According to the inventive concepts, a variety of other reading operations may be applied to multi-level nonvolatile memory device.

Figure 11:
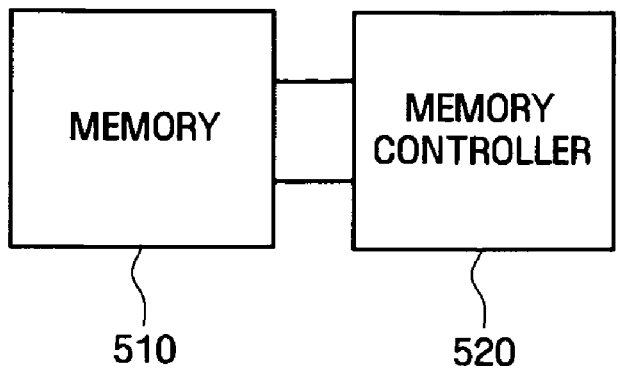
Figure 12:
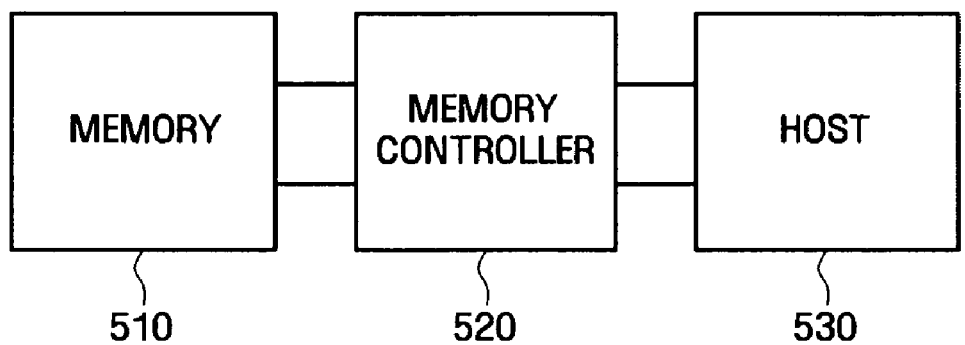
Figure 13:
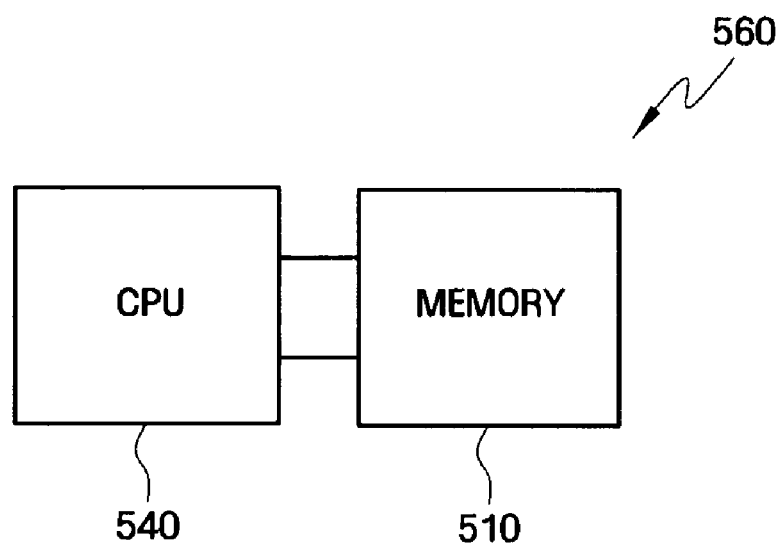

FIGS. 11-13 are diagrams illustrating systems utilizing nonvolatile memory devices according to example embodiments of the inventive concepts.

Referring to FIG. 11, a system according to example embodiments of the inventive concepts may include a memory 510 and a memory controller 520 connected to the memory 510. The memory 510 may include, for example, a nonvolatile memory device and/or a variable resistive element illustrated in FIGS. 1-10. The memory controller 520 may supply the memory 510 with input signals for controlling the operation of the memory 510, such as a command signal and an address signal for controlling read and write operations.

The system, including the memory 510 and the memory controller 520, may be embodied as a card such as a memory card. The system according to an embodiment of the present invention may be, for example, used in the form of a card satisfying a predetermined industry standard, embodied as a mobile phone, a two-way communication system, a one-way pager, a two-way pager, a personal communication system, a portable computer, a personal data assistant (PDA), an audio and/or video player, a digital and/or video camera, a navigation system, a global positioning system (GPS), and/or the like. Embodiments of the inventive concepts are not limited thereto and may be include various forms. For example, the system may be embodied as a memory stick.

Referring to FIG. 12, a system according to example embodiments of the inventive concepts may include a memory 510, a memory controller 520 and a host 530. The host 530 may be connected to the memory controller 520 through a bus, for example, and may supply the memory controller 520 with a control signal to control the operations of the memory controller 520 and the memory 510. The host 530 may be a processing system embodied as, for example, a mobile phone, a two-way communication system, a one-way pager, a two-way pager, a personal communication system, a portable computer, a personal data assistant (PDA), an audio and/or video player, a digital and/or video camera, a navigation system, a global positioning system (GPS), and/or the like.

While FIG. 12 may illustrate the memory controller 520 interposed between the memory 510 and the host 530, example embodiments of the inventive concepts are not limited thereto. For example, the memory controller 520 may not be provided.

Referring to FIG. 13, a system according example embodiments of the inventive concepts may be a computer system 560 including, for example, central processing unit (CPU) 540 and a memory 510. In the computer system 560, the memory 510 may be connected to the CPU 540 directly or through a general used computer bus architecture. The memory 510 may be used to store an operation system (OS) instruction set, a basic input/output start up (BIOS) instruction set, and/or an advanced configuration and power interface (ACPI) instruction set. The memory 510 may be used as a large-capacity storage device, such as a solid state disk (SSD).

For the sake of descriptive simplicity, all components of the computer system 560 may not be illustrated in FIG. 13 and example embodiments of the inventive concepts are not limited thereto. The memory controller 520 is not illustrated between the memory 510 and the CPU 540. According to example embodiments of the inventive concepts, the memory controller 520 may be provided between the memory 510 and the CPU 540.

While example embodiments of the inventive concepts have been particularly shown and described, it will be understood by one of ordinary skill in the art that variations in form and detail may be made therein without departing from the spirit and scope of the claims. It is therefore desired that the example embodiments if the inventive concepts be considered in all respects as illustrative and not restrictive, reference being made to the appended claims rather than the foregoing description to indicate the scope of the invention.

What is claimed is:

1. A multi-level nonvolatile memory device, comprising:
a word line;
a bit line; and
a multi-level memory cell coupled between the word line and the bit line, the multi-level memory cell configured to have:
a first resistance level upon application of a first write bias,
a second resistance level higher than the first resistance level upon application of a second write bias, the second write bias having a same polarity as the first write bias,
a third resistance level between the first and second resistance levels upon application of a third write bias, and
a fourth resistance level between the first and second resistance levels upon application of a fourth write bias, the third and fourth write biases having different polarities from each other.

2. The multi-level nonvolatile memory device of claim 1, wherein the multi-level memory cell includes:
a first electrode,
a first oxide layer on the first electrode, the first oxide layer configured to switch between a plurality of first resistance states based on the polarity of the write bias applied between the first and second electrodes,
a second oxide layer on the first oxide layer, the second oxide layer configured to switch between a plurality of second resistance states based on a level of the write bias, and
a second electrode on the second oxide layer.

3. The multi-level nonvolatile memory device of claim 2, wherein the first resistance states include a first set state and a first reset state, and
the second resistance states include a second set state and a second reset state.

4. The multi-level nonvolatile memory device of claim 3, wherein the resistance level of the multi-level memory cell is greater where the first and second oxide layers are switched to the first and second set states from the first reset state and the second set state, than from the first set state and the second reset state.

5. The multi-level nonvolatile memory device of claim 1, wherein the first oxide layer includes at least one of tungsten (W) oxide, titanium (Ti) oxide, tantalum (Ta) oxide, copper (Cu) oxide, and iron (Fe) oxide, and
the second oxide layer includes at least one of nickel (Ni) oxide, titanium (Ti) oxide, cobalt (Co) oxide, aluminum (Al) oxide, zinc (Zn) oxide, hafnium (Hf) oxide, niobium (Nb) oxide, and zirconium (Zr) oxide.

6. The multi-level nonvolatile memory device of claim 2, wherein the first oxide layer is thinner than the second oxide layer.

7. The multi-level nonvolatile memory device of claim 1, wherein an absolute value of a level of the first write bias is greater than an absolute value of a level of the second write bias, and
absolute values of levels of the third and fourth write bias are smaller than the absolute value of the level of the second write bias.

8. A multi-level nonvolatile memory device comprising:
a word line;
a bit line; and
a multi-level memory cell coupled between the word line and the bit line, the multi-level memory cell including:
a first electrode,
a first oxide layer on the first electrode, the first oxide layer configured to switch between a plurality of first resistance states based on a polarity of a write bias applied between the first and second electrodes,
a second oxide layer on the first oxide layer, the second oxide layer configured to switch between a plurality of second resistance states based on a level of the write bias, and
a second electrode on the second oxide layer.

9. The multi-level nonvolatile memory device of claim 8, wherein a concentration of oxygen in the first oxide layer gradually increases in a direction from the first electrode to the second electrode.

10. The multi-level nonvolatile memory device of claim 9, wherein the second oxide layer has a uniform concentration of oxygen relative to the first oxide layer.

11. The multi-level nonvolatile memory device of claim 8, wherein the first electrode and the first oxide layer include a same metal.

12. A multi-level memory element, comprising:
a first electrode;
a bipolar oxide layer directly on the first electrode;
a unipolar oxide layer directly on the bipolar oxide layer; and
a second electrode directly on the unipolar oxide layer.

13. The multi-level memory element of claim 12, wherein the bipolar oxide layer and the unipolar oxide layer are configured to switch between at least a set state and a reset state.

14. The multi-level memory element of claim 13, wherein the multi-level memory element is configured to switch the bipolar oxide layer to the reset state and the unipolar oxide layer to either the set or reset state using negative voltage.

15. The multi-level memory element of claim 14, wherein the multi-level memory element is configured to switch the bipolar oxide layer to the set state and the unipolar oxide layer to either the set or reset state using a same positive voltage.

16. The multi-level memory element of claim 15, wherein a concentration of oxygen increases between first and second surfaces of the bipolar oxide layer, and
a concentration of oxygen in the unipolar oxide layer is uniform relative to the bipolar oxide.

17. The multi-level memory element of claim 13, wherein a resistance of the bipolar oxide layer is about several tens of thousands of ohms in a set state and several hundred thousands of thousands of ohms in a reset state, and
a resistance of the unipolar oxide layer is about several thousands of ohms in the set state and several millions of ohms in the reset state.

18. The multi-level memory element of claim 13, wherein the multi-level memory element is configured to have 4 data states that are combinations of the set and reset states of the unipolar and bipolar oxide layers, and
the resistance levels corresponding to the data states are separated by at least about an order of magnitude.

19. An electronic system comprising the multi-level memory element of claim 12.

20. A memory card comprising the multi-level memory element of claim 12.

* * * * *